United States Patent [19]
Hellwig

[11] Patent Number: 5,789,309
[45] Date of Patent: Aug. 4, 1998

[54] METHOD AND SYSTEM FOR MONOCRYSTALLINE EPITAXIAL DEPOSITION

[75] Inventor: Lance G. Hellwig, St. Louis, Mo.

[73] Assignee: MEMC Electronic Materials, Inc., St. Peters, Mo.

[21] Appl. No.: 774,519

[22] Filed: Dec. 30, 1996

[51] Int. Cl.$^6$ .............. H01L 21/20; H01L 21/36; H01L 21/31; H01L 21/469
[52] U.S. Cl. .............. 438/478; 438/758; 438/935
[58] Field of Search ............... 438/478, 758, 438/711, 720, 935

[56] References Cited

U.S. PATENT DOCUMENTS

| | | | |
|---|---|---|---|
| 5,328,555 | 7/1994 | Gupta | 156/643 |
| 5,373,806 | 12/1994 | Logar | 117/106 |
| 5,488,925 | 2/1996 | Kumada | 118/715 |
| 5,517,943 | 5/1996 | Takahashi | 118/715 |
| 5,683,518 | 11/1997 | Moore et al. | 118/730 |

OTHER PUBLICATIONS

Chemical Equipment Technology, Inc. "Jupiter 2 Series Fume Scrubber", Information Summary, (5 pages, No Date) (Admitted Prior Art).

*Primary Examiner*—Brian Dutton
*Attorney, Agent, or Firm*—Senniger, Powers, Leavitt & Roedel

[57] ABSTRACT

A method for monocrystalline epitaxial deposition which reduces the occurrence of large area defects for chemical vapor depositions carried out at near atmospheric pressure. Reactant gas is passed over a semiconductor wafer in a reaction chamber to an exhaust in a conventional manner. A venturi tube in fluid communication with the reaction chamber is adjusted to draw a vacuum pressure in the reaction chamber. The relatively small vacuum pressure produces a more laminar flow of reactant gas leaving the reaction chamber. Reduction in turbulence and eddy currents reduces the possibility that particles from matter deposited near the exhaust of the reaction chamber can be transported upstream in the gas flow onto the wafer, causing large area defects. A system for carrying out the method is also disclosed.

7 Claims, 1 Drawing Sheet

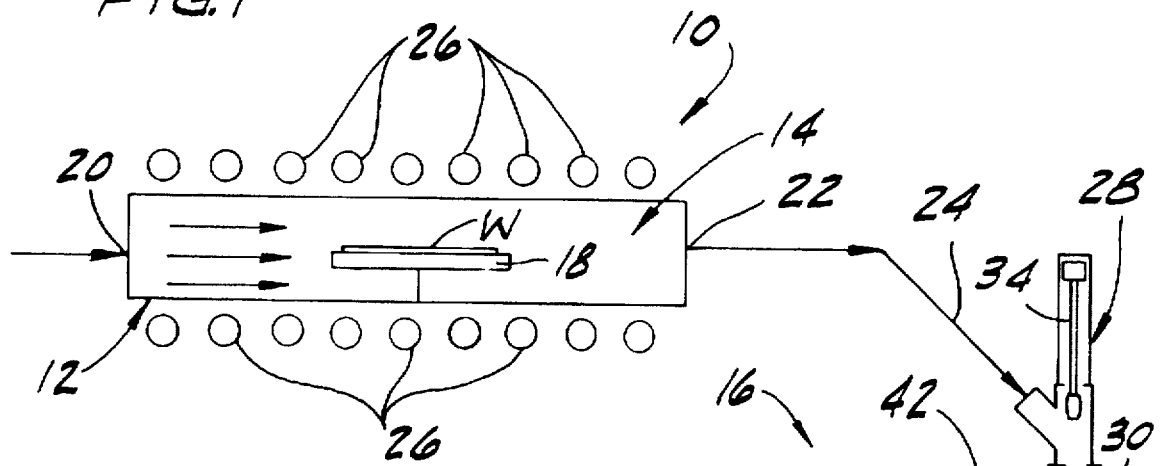
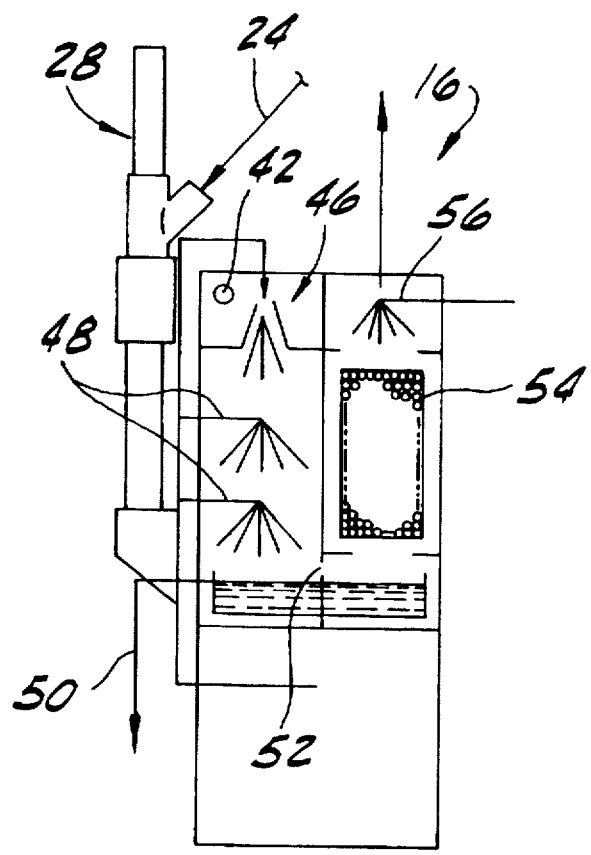
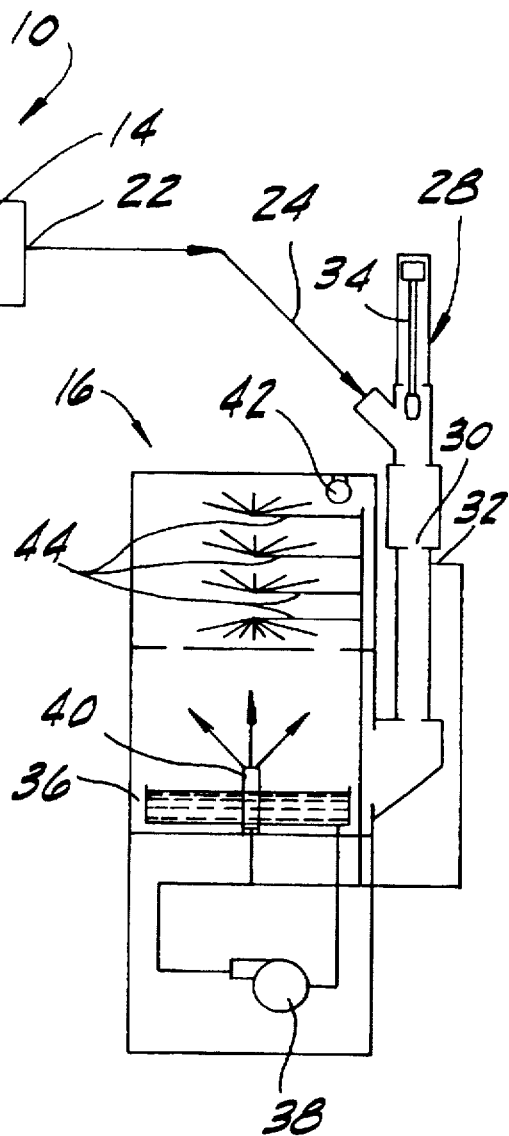

5,789,309

1

METHOD AND SYSTEM FOR MONOCRYSTALLINE EPITAXIAL DEPOSITION

BACKGROUND OF THE INVENTION

This invention relates generally to a method and system for monocrystalline epitaxial deposition and more particularly to a such a method and system which inhibits the creation of large area defects on a semiconductor wafer on which the epitaxial layer is deposited.

The present invention has particular application to standard CMOS epitaxial deposition of an initial epitaxial layer of monocrystalline material onto a monocrystalline substrate grown from a semiconductor source material, most commonly silicon. The epitaxial layer is formed by chemical vapor deposition, which is a process by which a stable solid may be formed by decomposition of chemical vapors using heat, plasma, ultraviolet light or other energy sources. Epitaxy is an important process in the semiconductor material industry for achieving the necessary electrical properties of the semiconductor material. For example, a lightly doped epitaxial layer grown over a heavily doped substrate permits a CMOS device to be optimized for latch up immunity as a result of the low resistance of the substrate. Other advantages, such as precise control of the dopant concentration profile and freedom from oxygen are also achieved.

Epitaxial growth is almost universally carried out by chemical vapor deposition because it is the most flexible and cost efficient method for growing epitaxial layers on semiconductor material. Generally speaking, chemical vapor deposition involves introduction of volatile reactants (e.g., $SiCl_4$, $SiHCl_3$, $SiH_2Cl_2$ or $SiH_4$) with a carrier gas (usually hydrogen) in a reactor. Achieving the desired epitaxial growth on the semiconductor material is also temperature dependent. Depending upon the precise reaction conditions the temperature in the reactor will vary, although in the monocrystalline layer deposition of the type to which the invention is particularly applicable, the temperature is generally between 1080° C. and 1150° C. The environment in which the deposition occurs must be clean with the oxygen content below 1 ppma.

Chemical vapor deposition is carried out in reactors which pass the reactants and carrier gas (collectively "reactant gas") generally parallel to the face of the semiconductor wafers. The reactant gas leaving the reactor is transported to a device for removing impurities (i.e., harmful components) of the gas before discharging it to the atmosphere. It is also important to avoid contamination of the wafers during the epitaxial deposition process caused by particles becoming deposited on the surface of the wafer. The material deposited from the reactant gas tends to accumulate more rapidly on the particle than on the flat surface surrounding it, producing a defect. Of particular concern are large area defects which have a diameter greater than or equal to 10 microns, as measured by laser beam surface scanning equipment, and more specifically as measured by a Tencor 6200 laser scanner manufactured by Tencor Inc. of Mountain View, Calif.

Common sources of particulate contamination are chlorinated silane polymers and $SiO_2$ which tend to deposit from the reactant gas on reaction chamber surfaces. In particular, the chlorinated silane polymers and $SiO_2$ become deposited in and around the exhaust port of the reaction chamber. Small particles from these deposits later break off and are carried by the gas onto the wafer. Deposition occurs because the temperature on the reaction chamber surfaces at the

2 exhaust tend to be somewhat lower than elsewhere in the reaction chamber. Turbulence and eddy currents in the flow permit particles from the exhaust port to be carried back to the wafer. The problem is particularly acute when the deposition is carried out at or near atmospheric pressure. Flow through the reaction chamber in depositions carried out at or near atmospheric pressure is conventionally provided by a slight positive pressure in the reactant gas just prior to entry into the reaction chamber. The scrubber conventionally does not draw a vacuum pressure (i.e., a pressure below atmospheric), or does not draw more than a negligible vacuum pressure in the reactor. Flow of effluent reactant gas at the exhaust port tends to be relatively turbulent under these conditions. However, by carrying out the deposition at atmospheric pressure, the reactor does not have to be as robust, and a vacuum pump is not required. Additional safety precautions, which are necessary for low pressure deposition processes because of the potential for explosion or fire, are not needed. Low pressure reactors (e.g., reactors for standard low pressure epitaxial deposition operated at about 75 torr) also are more sensitive to leaks because the low pressure draws outside air into the reactor. Thus whenever possible, it is desirable to carry out the epitaxial deposition at or near atmospheric pressure.

SUMMARY OF THE INVENTION

Among the several objects and features of the present invention may be noted the provision of a method and system for depositing an epitaxial layer on a semiconductor wafer which reduces area defects on the wafer; the provision of such a method and system which reduces the occurrence of large area defects; the provision of such a method and system which operates at near atmospheric pressure; the provision of such a method and system which produces a more nearly laminar flow of reactant gas through and out of the reaction chamber; and the provision of such a method and system which inhibits the transport of particulate matter to the wafer.

Generally, a method of the present invention comprises the steps of placing the wafer in an epitaxial reaction chamber of a reactor, and feeding reactant gas into the chamber such that the reactant gas passes over the wafer and reactant components in the gas are deposited in a monocrystalline layer on the wafer. Effluent reactant gas from the chamber is drawn through an exhaust port of the reaction chamber such that the pressure at the exhaust port is less than atmospheric but greater than or equal to about 20 torr below atmospheric thereby to prevent turbulence and eddy currents which could carry particulate matter back toward the wafer for inhibiting the formation of large area defects on the wafer. The effluent gas drawn from the reactor is scrubbed in a scrubber to remove impurities from the gas.

In another aspect of the present invention, a monocrystalline epitaxial layer deposition system generally comprises a reactor including a reaction chamber constructed for receiving at least one wafer of semiconductor material for deposition of a monocrystalline epitaxial layer on the wafer. An entry port receives reactant gas into the reaction chamber for deposit onto the semiconductor wafer in a monocrystalline layer, and an exhaust port discharges effluent reactant gas from the reaction chamber. A venturi tube in fluid communication with the exhaust port of the reaction chamber is positioned for aspirating effluent reactant gas exiting the reaction chamber into a flow of fluid passing axially through the venturi tube. The venturi tube is configured to draw a vacuum pressure measured at the exhaust port which is less than atmospheric, but greater or equal to than atmospheric less about 20 torr. The effluent reactant gas is cleansed by a scrubber.

Other objects and features of the present invention will be in part apparent and in part pointed out hereinafter.

BRIEF DESCRIPTION OF THE DRAWINGS

FIG. 1 is a schematic right side elevational view of a chemical vapor deposition reactor and a scrubber for cleaning effluent reactant gas from the reactor; and FIG. 2 is a left side elevational view of the scrubber.

Corresponding reference characters indicate corresponding parts throughout the several views of the drawings.

DETAILED DESCRIPTION OF THE PREFERRED EMBODIMENT

Referring now to the drawings, a monocrystalline epitaxial layer deposition system of the present invention is shown to comprise a reactor 10, including a reaction chamber vessel 12 defining a reaction chamber 14, and a scrubber 16 for removing potentially harmful components from the effluent reactant gas leaving the reactor (all reference numerals indicating their subjects generally). The reaction chamber vessel 12 is constructed of high purity quartz and the reaction chamber 14 is sized for receiving a single wafer W of semiconductor material for deposition of a monocrystalline epitaxial layer on the wafer. The wafer W is supported on a susceptor 18 which is mounted for rotating the wafer about a vertical axis during the epitaxial deposition process. The precise construction of the reactor 10 may be other than described without departing from the scope of the invention. For instance, a reactor could be constructed for processing multiple wafers at a time.

The reaction chamber vessel 12 has an entry port 20 through which reactant gas is received into the reaction chamber 14 for passing over the wafer W and depositing material (e.g., silicon) on the wafer. The flow of reactant gas through the reaction chamber 14 is generally indicated by the arrows at the left side of the chamber in FIG. 1. The reactant gas is discharged from the reaction chamber 14 through an exhaust port 22 into a discharge line 24 leading to the scrubber 16. The reactor 10 also includes heating lamps 26 for heating the reaction chamber 14 to temperatures most preferably between 1080° C. and 1150° C. However, it is to be understood that temperatures outside this range may be employed without departing from the scope of the present invention. In the preferred embodiment, the reactor 10 is an Epsilon One System epitaxial reactor manufactured by Advanced Semiconductor Materials, Inc. of Phoenix, Ariz.

The reactant gas used in the preferred embodiment is trichlorosilane ($SiHCl_3$) in a hydrogen ($H_2$) carrier gas. The trichlorosilane which contacts the wafer W decomposes to leave behind silicon which forms in monocrystalline layer on all exposed surfaces of the wafer. This reaction will work satisfactorily at atmospheric pressure. Therefore, no vacuum pump is required and the reactor chamber vessel 12 does not have to be as robust in order to prevent collapse. Moreover, fewer safety hazards are presented and the chance of air leaking into the reactor 10 is lessened.

Reactant gas leaving the reaction chamber 14 through the exhaust port 22 encounters relatively cooler surfaces of the reaction chamber vessel 12 and discharge line 24 around the exhaust port. As a result, some unreacted material in the reactant gas deposits on the reaction chamber vessel and discharge line interior surfaces around the exhaust port 22 in the form of chlorinated silane polymers and $SiO_2$. The remainder of the reactant gas is transferred by the discharge line 24 to an entry stack, generally indicated at 28, on the rear of the scrubber 16. The gas passes through a throat 30 within the entry stack 28, which is heated to prevent deposition of material from the gas on the stack at the throat. A water jet 32 injects water into the flow of gas just below the throat in such a manner as to induce a swirling motion in the flow. An automatic cleaning device mounted in the stack 28 includes an extensible and retractable rod 34 having a cleaning tip. The rod 34 may be selectively extended to force the cleaning tip through the throat to clean the throat 30. The effluent reactant gas moves downward in the stack 28 and enters the scrubber 16.

The scrubber 16 has multiple spray and filtering compartments for removing harmful components from the effluent reactant gas. In the preferred embodiment, the scrubber 16 is a Jupiter II series fume scrubber manufactured by Chemical Equipment Technology of San Jose, Calif. The scrubber 16 is constructed to hold a reservoir of water 36 in its lowest compartments. A pump 38 in the scrubber 16 underneath the compartments is operable to circulate the water through the scrubber as needed. The gas from the stack 28 passes into the first compartment just over the top of the reservoir. A first spray head 40 extending vertically up from the water in the reservoir 36 and fed by the pump 38, completely fills the first compartment with a fine water spray. Some of the more readily decomposed elements of the reactant gas are brought out of the gas and fall into the reservoir 36.

Openings at the top of the first compartment permit gas to pass upwardly into the second compartment toward an outlet 42 near the top of the second compartment. Four second spray heads 44 arranged vertically one above the other in the second compartment are fed by the pump 38 with water from the reservoir 36. The second spray heads 44 each provide a fine spray in a pattern which completely fills a respective horizontal section of the second compartment. The four spray patterns block the path of the gas through the second compartment to the outlet 42 except through the four spray patterns. Further impurities are removed from the gas as it passes upwardly successively through each of the four spray patterns generated by the respective spray heads 44 to the outlet 42.

Referring now to FIG. 2, the effluent reactant gas then passes through the outlet 42 of the second compartment, which doubles as an inlet for the third compartment. More particularly, the gas passes into a region which surrounds a water venturi tube, generally indicated at 46. Water from the reservoir 36 is forced by the pump 38 axially downwardly through the venturi tube 46, and produces a pressure drop on the downstream side of the throat of the tube. Multiple openings located just downstream of the throat of the venturi tube 46 expose the third compartment to a vacuum pressure (i.e., pressure below atmospheric) drawn on the downstream side of the venturi tube throat. Thus, the gas is aspirated into the flow of water, passing through the venturi tube 46 and downwardly into the fourth compartment.

The vacuum pressure is communicated back through the scrubber 16 and discharge line 24 to the reaction chamber 14 such that the pressure at the exhaust port 22 is about 753-754 torr (i.e., 6 to 7 torr below atmospheric). In practice, this pressure has been measured at about 3.5 to 4 feet from the junction of the one inch discharge line 24 with the reactor exhaust port 22. However, it is to be understood that any pressure which is less than atmospheric (e.g., 20 torr below atmospheric), but sufficiently capable of producing a laminar flow through the exhaust port 22 without requiring a more robust reactor could be used without departing from the scope of the present invention. It is believed that pressures as least as low as about 20 torr below atmospheric could be used to achieve further reductions in large area defects. The venturi tube 46 is adjustable to vary the vacuum pressure. It is important to be able to adjust the venturi tube 46 to optimize the reaction.

In the fourth compartment, the downwardly flowing effluent reactant gas passes consecutively through the spray patterns of two vertically arranged third spray heads 48. Like the second spray heads 44, the third spray heads 48 each produce a fine spray pattern which completely fills a horizontal section of the fourth compartment such that the passage of the gas through the fourth compartment is blocked except through the two spray patterns. The fourth compartment is open at its bottom to the reservoir 36, which receives additional components removed from the reactant gas. A drain line 50 operates to remove some of the water and impurities from the reservoir 36.

The effluent reactant gas, now substantially cleansed of impurities, pass through one of four openings 52 (only one is shown) at the bottom of the fourth compartment just above the reservoir water level and into a fifth compartment. The fifth compartment is also exposed at its bottom to the water reservoir 36. The gas then turns upward to pass into a sixth compartment containing a filter column 54, which is formed by a bundle of small plastic cylinders in the illustrated embodiment. The filter column 54 is arranged in the sixth compartment such that passage of gas upwardly through the sixth compartment is blocked except through the filter column.

A fourth spray head 56 located in a seventh compartment above the sixth compartment sprays water downward onto the filter column 54. The water passes through the filter column 54 and keeps it clean. Ultimately, the water enters the reservoir 36. The water sprayed through the fourth spray head 56 is supplied by an outside source of make up water, not from the reservoir 36. In this way, the supply of water to the reservoir 36 is replenished and maintained at an acceptable level of purity. It has been found that a make up water flow rate of about 3 gallons per minute produces satisfactory results. Gas passing upwardly into the seventh compartment must pass through the spray pattern of the fourth spray head 56, and then exits the scrubber 16 upwardly to the atmosphere.

The method of the present invention comprises placing the semiconductor wafer W on which an epitaxial layer is to be deposited in the reaction chamber 14 on the susceptor 18. Typically (but not exclusively), the deposition process is a standard CMOS epitaxial deposition in which the first epitaxial layer of monocrystalline material is deposited on all exposed surfaces of the wafer with substantially uniform layer thickness. The reaction chamber 14 is heated to about 1150° C. by the heating lamps 26. The reactant gas is fed into the reaction chamber 14 through the entry port 20 and moves toward the exhaust port 22, passing over the wafer W in the chamber as it is rotated by the susceptor 18. Some of the silicon from the reactant gas decomposes onto the wafer W in a single crystal layer. The flow of the reactant gas through the reaction chamber 14 is partially driven by the vacuum pressure caused by the venturi tube 46 in the scrubber 16.

Reactant gas passes out of the reaction chamber 14 through the exhaust port 22. The vacuum pressure measured at the exhaust port 22 is adjusted, by adjustment of the venturi tube 46 in the scrubber 16, so that the pressure is preferably about 6 to 7 torr below atmospheric. The vacuum pressure at the exhaust port 22 produces a relatively laminar flow of the reactant gas into the exhaust port. The reduction in turbulence and eddy currents in the flow makes it much less likely that any particulate matter which has been deposited on reaction chamber surfaces around the exhaust port 22 will be able to travel upstream (with respect to the direction of reactant gas flow) in the reaction chamber 14 and become deposited on the wafer W. Accordingly, there are fewer observed large area defects caused by such particles.

The effluent reactant gas leaving the reaction chamber 14 passes into the entry stack 28 of the scrubber 16, through the throat 30 and into the swirling flow from the water jet 32. The water jet 32 is fed by the pump 38 with water from the reservoir 36. The gas then enters the first compartment, which is filled with a fine spray mist from the first spray head 40. The gas is drawn upwardly into the second compartment and through the four layers of spray patterns made by the second spray heads 44. The gas passes out of the second compartment through the outlet 42 and into the third compartment around the venturi tube 46, where it is aspirated through openings into the water stream passing through the venturi tube 46. It is to be understood that a gas stream passing axially through the venturi tube 46 could be used instead of liquid to aspirate the effluent reactant gas, and produce the vacuum pressure at the exhaust port 22. Moreover, a venturi tube (not shown) could be located other than where described, such as just downstream of the exhaust port 22, but prior to entry into the scrubber 16.

The effluent reactant gas in the liquid stream from the venturi tube 46 passes into the fourth compartment and through the two vertically arranged spray patterns formed by the third spray heads 48 in the fourth compartment. In the fourth compartment, some water in the reservoir 36 at the bottom of the compartment is removed through drain line 50 to remove the captured components from the reactant gas. The openings 52 just above the water level in the reservoir 36 permit gas to pass laterally off the scrubber 16 into a fifth compartment over the reservoir 36. The gas then turns upwardly into the sixth compartment where it passes through the filter column 54, and into the seventh compartment. The fourth spray head 56 provides one final spray pattern through which the gas passes before being exhausted to the atmosphere. Water from the fourth spray head 56 passes down through the filter column 54 and into the reservoir 36 to make up water drained from the reservoir.

After a sufficient time, the wafer W is then removed from the reaction chamber 14 for additional processing. It has been found that increased flow rates caused by the vacuum pressure produce a more rapid growth rate of epitaxial silicon on the wafer W. The wafers processed according to the present method have been found to have significantly reduced occurrences of large area defects. It has been observed that the median number of large area defects per wafer (i.e., defects larger than 10 microns as measured by the Tencor 6200 laser scanning equipment) has been reduced by more than a third at pressures of about 7 torr below atmospheric (i.e., 753 torr). It is believed further reductions in large area defects will be observed by further reduction of the operating pressure, at least down to about 20 torr below atmospheric (i.e., 740 torr).

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method for depositing a monocrystalline epitaxial layer on a wafer of semiconductor material in which the formation of large area defects is inhibited, the method comprising the steps of:

placing the wafer in an epitaxial reaction chamber of a reactor;

feeding reactant gas into the reaction chamber such that the reactant gas passes over the wafer and reactant components in the gas are deposited in the monocrystalline epitaxial layer on the wafer;

drawing effluent reactant gas from the chamber through an exhaust port of the reaction chamber such that a pressure at the exhaust port is less than atmospheric pressure but greater than or equal to about 20 torr below said atmospheric pressure thereby to prevent turbulence and eddy currents which could carry particulate matter back toward the wafer for inhibiting the formation of large area defects on the wafer;

scrubbing the effluent reactant gas drawn from the reactor in a scrubber to clean the effluent reactant gas.

2. A method as set forth in claim 1 wherein the step of maintaining the pressure at the exhaust port comprises maintaining the pressure in a range less than said atmospheric pressure but greater than or equal to about 7 torr below said atmospheric pressure.

3. A method as set forth in claim 2 wherein the temperature in the reaction chamber is about in a range of 1080° C. to 1150° C.

4. A method as set forth in claim 1 wherein the step of drawing effluent reactant gas from the reaction chamber comprises the steps of aspirating the effluent reactant gas in the scrubber into a fluid stream thereby to produce the pressure at the exhaust port of the reaction chamber of less than said atmospheric pressure.

5. A method as set forth in claim 4 wherein the step of aspirating comprises aspirating the effluent gas into a liquid stream.

6. A method as set forth in claim 1 wherein the step of placing the wafer in the reaction chamber comprises the step of placing a semiconductor wafer having no prior epitaxial layers deposited thereon.

7. A method as set forth in claim 1 wherein the step of placing the wafer comprises the step of placing a plurality of semiconductor wafers into the reaction chamber.

* * * * *